(12) United States Patent
Hayakawa et al.

(10) Patent No.: US 11,335,514 B2
(45) Date of Patent: May 17, 2022

(54) SOLAR CELL

(71) Applicant: SEKISUI CHEMICAL CO., LTD., Osaka (JP)

(72) Inventors: Akinobu Hayakawa, Osaka (JP); Tetsuya Kurebayashi, Osaka (JP); Naohiro Fujinuma, Ibaraki (JP); Masako Okamoto, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 42 days.

(21) Appl. No.: 16/632,578

(22) PCT Filed: Sep. 20, 2018

(86) PCT No.: PCT/JP2018/034792
§ 371 (c)(1),
(2) Date: Jan. 21, 2020

(87) PCT Pub. No.: WO2019/059270
PCT Pub. Date: Mar. 28, 2019

(65) Prior Publication Data
US 2020/0161060 A1 May 21, 2020

(30) Foreign Application Priority Data

Sep. 21, 2017 (JP) .............................. JP2017-181608
Sep. 28, 2017 (JP) .............................. JP2017-188698

(51) Int. Cl.
*H01L 51/00* (2006.01)
*H01L 51/42* (2006.01)
(Continued)

(52) U.S. Cl.
CPC ........... *H01G 9/2009* (2013.01); *H01L 22/20* (2013.01); *H01L 51/0008* (2013.01);
(Continued)

(58) Field of Classification Search
CPC ............. H01L 51/0008; H01L 51/0035; H01L 51/0043; H01L 51/0077; H01L 51/4213; H01L 22/20; H01G 9/2009
See application file for complete search history.

(56) References Cited

U.S. PATENT DOCUMENTS

2016/0079552 A1* 3/2016 Su ...................... H01L 51/0032
136/260
2017/0084399 A1 3/2017 Vak
(Continued)

FOREIGN PATENT DOCUMENTS

JP 2014-072327 4/2014
JP 2016-139805 8/2016
(Continued)

OTHER PUBLICATIONS

International Search Report dated Dec. 11, 2018 in International (PCT) Patent Application No. PCT/JP2018/034792.
(Continued)

*Primary Examiner* — Mayla Gonzalez Ramos
(74) *Attorney, Agent, or Firm* — Wenderoth, Lind & Ponack, L.L.P.

(57) ABSTRACT

The present invention aims to provide a solar cell that includes a photoelectric conversion layer containing an organic-inorganic perovskite compound and that can exhibit high photoelectric conversion efficiency and high heat resistance. Provided is a solar cell including, in the stated order: a cathode; a photoelectric conversion layer; and an anode, the photoelectric conversion layer containing an organic-inorganic perovskite compound represented by the formula $R\text{-}M\text{-}X_3$ where R is an organic molecule, M is a metal atom,
(Continued)

and X is a halogen atom or a chalcogen atom, and a polymer having an acid dissociation constant pKa of 3 or less.

12 Claims, 2 Drawing Sheets

(51) Int. Cl.
H01G 9/20 (2006.01)
H01L 21/66 (2006.01)

(52) U.S. Cl.
CPC ...... *H01L 51/0035* (2013.01); *H01L 51/0043* (2013.01); *H01L 51/0077* (2013.01); *H01L 51/4213* (2013.01)

(56) References Cited

U.S. PATENT DOCUMENTS

| | | |
|---|---|---|
| 2017/0221639 A1 | 8/2017 | Hayakawa et al. |
| 2018/0212086 A1 | 7/2018 | Kurebayashi et al. |
| 2018/0331308 A1* | 11/2018 | Kessler .............. H01L 51/506 |
| 2020/0251674 A1 | 8/2020 | Hayakawa et al. |

FOREIGN PATENT DOCUMENTS

| | | |
|---|---|---|
| JP | 2017-112185 | 6/2017 |
| WO | 2016/060156 | 4/2016 |
| WO | 2017/022687 | 2/2017 |
| WO | 2017/121984 | 7/2017 |
| WO | 2017/135293 | 8/2017 |

OTHER PUBLICATIONS

Lee et al., "Efficient Hybrid Solar Cells Based on Meso-Superstructured Organometal Halide Perovskites", Science, 2012, vol. 338, pp. 643.

Extended European Search Report dated May 21, 2021 in corresponding European Patent Application No. 18858581.4.

Seo et al., "Novel p-dopant toward highly efficient and stable perovskite solar cells", Energy & Environmental Science, vol. 11, No. 10, 2018, pp. 2985-2992.

* cited by examiner

● : M
● : R
● : X

SOLAR CELL

TECHNICAL FIELD

The present invention relates to a solar cell that includes a photoelectric conversion layer containing an organic-inorganic perovskite compound and that can exhibit high photoelectric conversion efficiency and high heat resistance.

BACKGROUND ART

Solar cells provided with a laminate (photoelectric conversion layer) having an N-type semiconductor layer and a P-type semiconductor layer disposed between opposing electrodes have been conventionally developed. Such solar cells generate photocarriers (electron-hole pairs) by photoexcitation so that electrons and holes move through the N-type semiconductor and the P-type semiconductor, respectively, to create an electric field.

Most solar cells currently in practical use are inorganic solar cells which are produced using inorganic semiconductors made of silicon or the like. The inorganic solar cells, however, are utilized only in a limited range because their production is costly and upsizing thereof is difficult. Therefore, organic solar cells produced using organic semiconductors instead of inorganic semiconductors and organic inorganic solar cells combining organic semiconductors and inorganic semiconductors have received attention.

In particular, perovskite solar cells that include a photoelectric conversion layer containing an organic-inorganic perovskite compound are promising to achieve high photoelectric conversion efficiency. In addition, such perovskite solar cells can be produced by a printing method, thus allowing a significant reduction in production cost (e.g., Patent Literature 1 and Non-Patent Literature 1).

With the intense competition, solar cells having higher photoelectric conversion efficiency have been demanded.

CITATION LIST

Patent Literature

Patent Literature 1: JP 2014-72327 A

Non-Patent Literature

Non-Patent Literature 1: M. M. Lee et al, Science, 2012, 338, 643

SUMMARY OF INVENTION

Technical Problem

The present invention aims to provide a solar cell that includes a photoelectric conversion layer containing an organic-inorganic perovskite compound and that can exhibit high photoelectric conversion efficiency and high heat resistance.

Solution to Problem

The present invention relates to a solar cell including, in the stated order: a cathode; a photoelectric conversion layer; and an anode, the photoelectric conversion layer containing an organic-inorganic perovskite compound represented by the formula $R-M-X_3$ where R is an organic molecule, M is a metal atom, and X is a halogen atom or a chalcogen atom, and a polymer having an acid dissociation constant pKa of 3 or less.

The present invention is described in detail below.

The solar cell of the present invention contains an organic-inorganic perovskite compound and a polymer having an acid dissociation constant pKa of 3 or less (hereinafter also referred to as an "acidic polymer"). The use of the organic-inorganic perovskite compound in combination with the acidic polymer can improve the photoelectric conversion efficiency of the solar cell.

The reason for the improvement is unclear. Presumably, the incorporation of the acidic polymer into the photoelectric conversion layer containing an organic-inorganic perovskite compound allows the electrons and holes generated by photoexcitation to efficiently move without being recombined, thus improving the photoelectric conversion efficiency of the solar cell.

The solar cell that includes a photoelectric conversion layer containing an organic-inorganic perovskite compound is also called an "organic-inorganic hybrid solar cell".

The organic-inorganic perovskite compound is represented by the formula $R-M-X_3$ (R is an organic molecule, M is a metal atom, and X is a halogen atom or a chalcogen atom.).

R is an organic molecule and is preferably represented by $C_l N_m H_n$ (l, m, and n are each a positive integer).

Specific examples of R include methylamine, ethylamine, propylamine, butylamine, pentylamine, hexylamine, dimethylamine, diethylamine, dipropylamine, dibutylamine, dipentylamine, dihexylamine, trimethylamine, triethylamine, tripropylamine, tributylamine, tripentylamine, trihexylamine, ethylmethylamine, methylpropylamine, butylmethylamine, methylpentylamine, hexylmethylamine, ethylpropylamine, ethylbutylamine, formamidine, acetoamidine, guanidine, imidazole, azole, pyrrole, azetidine, azirine, azetidine, azete, azole, imidazoline, carbazole, ions of these (e.g., methylammonium ($CH_3NH_3$)), and phenethylammonium. Preferred among these are methylamine, ethylamine, propylamine, butylamine, pentylamine, hexylamine, formamidine, acetoamidine, ions of these, and phenethylammonium. More preferred are methylamine, ethylamine, propylamine, formamidine, and ions of these.

M is a metal atom, and examples thereof include lead, tin, zinc, titanium, antimony, bismuth, nickel, iron, cobalt, silver, copper, gallium, germanium, magnesium, calcium, indium, aluminum, manganese, chromium, molybdenum, and europium. These metal atoms may be used alone or two or more of these may be used in combination.

X is a halogen atom or a chalcogen atom, and examples thereof include chlorine, bromine, iodine, oxygen, sulfur, and selenium. When X is a halogen atom or a chalcogen atom, the perovskite compound has a wider absorption wavelength range, thus achieving high photoelectric conversion efficiency. These halogen atoms or chalcogen atoms may be used alone or two or more of these may be used in combination. Preferred among these is a halogen atom because the organic-inorganic perovskite compound containing halogen in the structure is soluble in an organic solvent to be usable in an inexpensive printing method or the like. More preferred is iodine because the organic-inorganic perovskite compound has a narrower energy band gap.

The organic-inorganic perovskite compound preferably has a cubic crystal structure where the metal atom M is placed at the body center, the organic molecule R is placed at each vertex, and the halogen atom or chalcogen atom X is placed at each face center.

FIG. 1 is a schematic view of an exemplary crystal structure of the organic-inorganic perovskite compound having a cubic crystal structure where the metal atom M is placed at the body center, the organic molecule R is placed at each vertex, and the halogen atom or chalcogen atom X is placed at each face center. Although the details are not clear, it is presumed that this structure allows the octahedron in the crystal lattice to change its orientation easily, which enhances the mobility of electrons in the organic-inorganic perovskite compound, improving the photoelectric conversion efficiency of the solar cell.

The organic-inorganic perovskite compound is preferably a crystalline semiconductor. The crystalline semiconductor means a semiconductor whose scattering peak can be detected by the measurement of X-ray scattering intensity distribution. When the organic-inorganic perovskite compound is a crystalline semiconductor, the mobility of electrons in the organic-inorganic perovskite compound is enhanced, improving the photoelectric conversion efficiency of the solar cell.

The degree of crystallinity can also be evaluated as an index of crystallization. The degree of crystallinity can be determined by separating a crystalline substance-derived scattering peak from an amorphous portion-derived halo, which are detected by X-ray scattering intensity distribution measurement, by fitting, determining their respective intensity integrals, and calculating the ratio of the crystalline portion to the whole.

The lower limit of the degree of crystallinity of the organic-inorganic perovskite compound is preferably 30%. When the degree of crystallinity is 30% or more, the mobility of electrons in the organic-inorganic perovskite compound is enhanced, improving the photoelectric conversion efficiency of the solar cell. The lower limit of the degree of crystallinity is more preferably 50%, further preferably 70%.

Examples of the method for increasing the degree of crystallinity of the organic-inorganic perovskite compound include heat annealing, irradiation with light having strong intensity, such as laser, and plasma irradiation.

The acidic polymer has an acid dissociation constant pKa of 3 or less. The incorporation of the acidic polymer having an acid dissociation constant pKa of 3 or less into the photoelectric conversion layer containing an organic-inorganic perovskite compound allows the resulting solar cell to have excellent photoelectric conversion efficiency. The acid dissociation constant pKa of the acidic polymer is preferably 1 or less, more preferably −1 or less, still more preferably −2.8 or less, particularly preferably −5 or less.

The acid dissociation constant pKa as used herein is a quantitative measure of the strength of an acid. It is the equilibrium constant pKa for dissociation reaction that involves release of a hydrogen ion, expressed as a negative common logarithm. A smaller pKa value indicates a stronger acid.

The lower limit of the pKa is not limited, and may be −25, for example.

The acidic polymer may be in the form of an ion or a salt as long as it has an acid dissociation constant pKa of 3 or less.

The acidic polymer is a polymer. Due to the acidic polymer being a polymer, the resulting solar cell can have both high conversion efficiency and high heat resistance. This is presumably because the acidic polymer being a polymer segregates in the formation of the photoelectric conversion layer to concentrate only at the very surface of the photoelectric conversion layer, and thus does not reduce the heat resistance of the photoelectric conversion layer as a whole.

The polymer as used herein means a polymer consisting of two or more monomer repeat units.

The lower limit of the weight average molecular weight of the acidic polymer is preferably 2,000 and the upper limit thereof is preferably 1,000,000. When the weight average molecular weight of the acidic polymer is within this range, both higher conversion efficiency and higher heat resistance can be achieved. The lower limit of the weight average molecular weight of the acidic polymer is more preferably 4,000 and the upper limit thereof is more preferably 500,000. The lower limit is still more preferably 5,000 and the upper limit is still more preferably 100,000.

The weight average molecular weight herein is measured in terms of polystyrene by gel permeation chromatography (GPC). The column used for the measurement of the weight average molecular weight in terms of polystyrene by GPC may be, for example, HSPgel RT MB-M (available from Waters Corporation). The solvent used for GPC may be dimethylsulfoxide, for example.

The acidic polymer may be, for example, a halogen-containing polymer having an acid dissociation constant pKa of 3 or less selected from halogen-containing polymers having a structure of the following formula ($X^H$) containing a halogen atom and electron-withdrawing groups bonded to a hetero atom.

[Chem. 1]

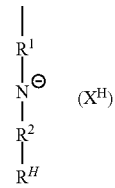

In the formula ($X^H$), $R^1$ and $R^2$ are each an electron-withdrawing group and $R^H$ is a group containing a halogen atom. $R^1$ and $R^2$ may be the same as or different from each other.

In the formula ($X^H$), the electron-withdrawing groups represented by $R^1$ and $R^2$ are not limited. Preferred are sulfonyl, sulfide, sulfinyl, thioester, thioketone, ester, ether, carbonyl, amide, and urethane groups. Any of these electron-withdrawing groups may be used alone or two or more types thereof may be used in combination. More preferred among these is a sulfonyl group.

In the formula ($X^H$), the group containing a halogen atom represented by $R^H$ is not limited, provided that it contains a halogen atom as described above. Preferably, the group contains a fluorine atom. When the group contains a fluorine atom, the halogen-containing polymer is more easily dissolved in an organic solvent, further facilitating formation of the photoelectric conversion layer.

The group containing a fluorine atom is not limited, and is preferably an alkyl or aryl group in which some or all of the hydrogen atoms are substituted by fluorine atom(s).

In the formula ($X^H$), the group containing a halogen atom represented by $R^H$ is preferably a halogen atom or an alkyl or aryl group in which some or all of the hydrogen atoms are substituted by halogen atom(s).

Specific examples of the halogen-containing polymer include polymers having a structural unit of the following formula ($1^H$).

[Chem. 2]

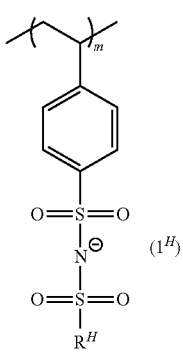

In the formula ($1^H$), $R^H$ is a halogen atom or an alkyl or aryl group in which some or all of the hydrogen atoms are substituted by halogen atom(s), and m is an integer of 2 or more.

In the polymer having a structural unit of the formula ($1^H$), not all the structural units are required to be the structural unit of the formula ($1^H$). The polymer having a structural unit of the formula ($1^H$) may contain a different structural unit, provided that it contains a structural unit of the formula ($1^H$).

The different structural unit is not limited, and examples thereof include structural units derived from styrene derivatives, (meth)acrylic acid esters, vinyl ether, (meth)acrylamide, and the like.

The polymer having an acid dissociation constant pKa of 3 or less is preferably a fluorine-containing polymer containing a structural unit that has a structure containing a fluorine atom and an electron-withdrawing group bonded to a hetero atom.

Due to the presence of the fluorine atom, the fluorine-containing polymer can be easily dissolved in an organic solvent, and thus can be easily incorporated in the photoelectric conversion layer.

The fluorine-containing polymer may be in the form of ions (anion, cation) or the form of a salt as long as it has a structure that contains a fluorine atom and an electron-withdrawing group bonded to a hetero atom.

The hetero atom is not limited, and examples thereof include nitrogen, oxygen, and sulfur atoms. In particular, preferred are nitrogen and sulfur atoms, and more preferred is a nitrogen atom.

The electron-withdrawing group in the fluorine-containing polymer is not limited, and examples thereof include sulfonyl, sulfide, thioester, thioketone, ester, ether, carbonyl, amide, urethane, sulfinyl, and phosphonyl groups. Any of these electron-withdrawing groups may be used alone or two or more types thereof may be used in combination. One electron-withdrawing group or two or more electron-withdrawing groups may be bonded to the hetero atom.

At least one fluorine atom is preferably bonded to the electron-withdrawing group or α-position of the electron-withdrawing group.

The fluorine-containing polymer preferably has a conjugated cyclic skeleton through the electron-withdrawing group. When the fluorine-containing polymer has a conjugated cyclic skeleton through the electron-withdrawing group, the acidity of the hetero atom increases, so that the fluorine-containing polymer can have a pKa of 3 or less.

The fluorine-containing polymer preferably has a structure of the formula ($X^F$) containing a fluorine atom and electron-withdrawing groups bonded to a hetero atom.

[Chem. 3]

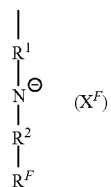

In the formula ($X^F$), $R^1$ and $R^2$ are each an electron-withdrawing group and $R^F$ is a group containing a fluorine atom. $R^1$ and $R^2$ may be the same as or different from each other.

The electron-withdrawing groups represented by $R^1$ and $R^2$ in the formula ($X^F$) are not limited, and are preferably sulfonyl, sulfide, sulfinyl, thioester, thioketone, ester, ether, carbonyl, amide, or urethane groups. Any of these electron-withdrawing groups may be used alone or two or more thereof may be used in combination. The electron-withdrawing groups are more preferably sulfonyl groups.

In the formula ($X^F$), the group containing a fluorine atom represented by $R^F$ is not limited, and is preferably an alkyl or aryl group in which some or all of the hydrogen atoms are substituted by fluorine atom(s).

Specific examples of the fluorine-containing polymer include polymers having a structural unit of the following formula ($1^F$).

[Chem. 4]

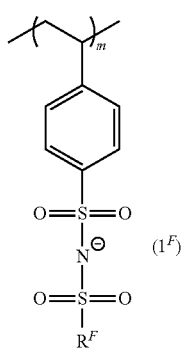

In the formula ($1^F$), $R^F$ is a fluorine atom or an alkyl or aryl group in which some or all of the hydrogen atoms are substituted by fluorine atom(s), and m is an integer of 2 or more.

In the polymer having a structural unit of the formula ($1^F$), not all the structural units are required to be the structural unit of the formula ($1^F$). The polymer having a structural unit of the formula ($1^F$) may contain a different structural unit, provided that it contains a structural unit of the formula ($1^F$).

The different structural unit is not limited, and examples thereof include structural units derived from styrene derivatives, (meth)acrylic acid esters, vinyl ether, (meth)acrylamide, and the like.

Examples of the method for synthesizing the fluorine-containing polymer include a method of polymerizing a monomer having a structure that contains a fluorine atom and an electron-withdrawing group bonded to a hetero atom, and a method of polymerizing a monomer containing neither a fluorine atom nor a structure that contains an electron-withdrawing group bonded to a hetero atom and then adding a fluorine atom and a structure that contains an electron-withdrawing group bonded to a hetero atom by a chemical reaction.

In the case where the fluorine-containing polymer is incorporated in a hole transport layer, high photoelectric conversion efficiency can be achieved. However, in such a case, the resulting solar cell may have poor light resistance.

In the solar cell of the present invention, however, when the fluorine-containing polymer as the polymer having an acid dissociation constant pKa of 3 or less is incorporated in the photoelectric conversion layer, excellent light resistance as well as high photoelectric conversion efficiency and excellent heat resistance can be achieved by adjusting the distribution of the fluorine-containing polymer such that a surface of the photoelectric conversion layer has a specific distribution of iodine and fluorine elements. Specifically, in the solar cell of the present invention, on an anode-side surface, $\alpha$ and $\beta$ calculated by the following steps (A) to (C) preferably satisfy $\alpha > 0.6$ and $\beta < 0.2$. This allows the solar cell of the present invention to exhibit excellent light resistance.

In the step (A), first, sputtering is performed on the anode-side surface n times (n is an integer including 0), and a ratio $F(n)$ of the intensity of a fluoride ion to the total ion intensity and a ratio $I(n)$ of the intensity of an iodide ion to the total ion intensity on the surface are measured by TOF-SIMS after each sputtering.

Time-of-flight secondary ion mass spectrometry (TOF-SIMS) is a technique that irradiates a solid sample with an ion (primary ion) beam and performs mass separation of the ions (secondary ions) discharged from the surface based on the difference in time-of-flight (time-of-flight is proportional to the square root of the weight). TOF-SIMS can detect information of elements or molecular pieces present within 1 nm from the sample surface with high detection sensitivity.

The analyzing device used for TOF-SIMS may be a commercial product such as "PHI nanoTOF II" available from ULVAC-PHI, Inc.

For the measurement of the fluoride ion intensity, iodide ion intensity, and total ion intensity of the anode-side surface of the solar cell using a commercial TOF-SIMS analyzing device, for example, a $Bi^{3+}$ ion gun may be used as a primary ion source for measurement, and the measurement may be performed at 30 keV.

Sputtering involves introducing an inert gas such as argon into vacuum and applying negative voltage to a target to generate a glow discharge. The glow discharge ionizes the inert gas atoms, and the gas ions collide with the target surface at high velocity to vigorously strike the surface. Sputtering enables grinding of the surface of the target to a depth on the order of nanometers to micrometers.

Specifically, for example, sputtering using $O^{2+}$ allows excavation of the surface of the photoelectric conversion layer at a depth of 0.01 nm to 10 nm/sputtering.

By performing sputtering n times (n is an integer including 0) and measuring the ratio $F(n)$ of the intensity of the fluoride ion to the total ion intensity and the ratio $I(n)$ of the intensity of the iodide ion to the total ion intensity by TOF-SIMS after each sputtering, it is possible to determine the distribution of fluorine and iodine elements in the depth direction from the anode-side surface of the solar cell.

In the step (B), based on the relation between n and $F(n)$ and $I(n)$ obtained in the step (A), sputtering cumulative time N, a ratio $F(N)$ of the intensity of the fluoride ion to the total ion intensity (fluoride ion intensity/total ion intensity) at the sputtering cumulative time N, and a ratio $I(N)$ of the intensity of the iodide ion to the total ion intensity (iodide ion intensity/total ion intensity) at the sputtering cumulative time N are calculated.

A longer sputtering cumulative time N results in analysis at a portion deeper from the anode-side surface of the solar cell. Using the sputtering cumulative time N and the ratio $F(n)$ of the intensity of the fluoride ion to the total ion intensity and the ratio $I(n)$ of the intensity of the iodide ion to the total ion intensity at the sputtering cumulative time N makes it possible to express the concentration distribution of fluorine and iodine elements in the depth direction from the anode-side surface of the solar cell.

In the step (C), based on the sputtering cumulative time N, $F(N)$, and $I(N)$ obtained in the step (B), a graph is plotted with the sputtering cumulative time N on the horizontal axis and $F(N)$ and $I(N)$ values normalized to their maximum values as 1 on the vertical axis. $\alpha$ and $\beta$ are calculated from the graph.

FIG. 2 is a schematic view illustrating a graph plotted with the sputtering cumulative time N on the horizontal axis and $F(N)$ and $I(N)$ values normalized to their maximum values as 1 on the vertical axis.

The graph in FIG. 2 plots the sputtering cumulative time N on the horizontal axis and $F(N)$ and $I(N)$ values normalized to their maximum value as 1 on the vertical axis.

In FIG. 2, the dotted curve shows the progression of $F(N)$, while the solid curve shows the progression of $I(n)$.

In FIG. 2, as the sputtering cumulative time N progresses, first, the dotted curve showing the progress of $F(N)$ rises, peaks, and then moderately declines. The solid curve showing the progress of $I(N)$ rises after the dotted curve, peaks, and then moderately declines.

Suppose that Nmax is N at which $I(N)$ reaches its maximum value, intersections of $I(N)$ and $F(N)$ are observed in the region of N<Nmax and the region of N≥Nmax.

$\alpha$ is determined as the value of $I(N)$ and $F(N)$ at an intersection of $I(N)$ and $F(N)$ at which N is closest to Nmax among the intersections of $I(N)$ and $F(N)$ in the region of N<Nmax.

$\beta$ is determined as the value of $I(N)$ and $F(N)$ at an intersection of $I(N)$ and $F(N)$ at which N is closest to Nmax among the intersections of $I(N)$ and $F(N)$ in the region of N≥Nmax.

In the case of the photoelectric conversion layer containing the fluorine-containing polymer as the polymer having an acid dissociation constant pKa of 3 or less, when $\alpha$ and $\beta$ calculated by the steps (A) to (C) satisfy $\alpha > 0.6$ and $\beta < 0.2$, the solar cell can exhibit excellent light resistance as well as high photoelectric conversion efficiency and excellent heat resistance. Although the principle for this is unclear, the present inventors presume as follows.

That is, satisfying $\alpha > 0.6$ presumably indicates that fluorine and iodine elements are mixed at comparatively high concentrations at the very surface on the anode side of the photoelectric conversion layer in the solar cell, in other words, the fluorine-containing polymer is concentrated at the very surface on the anode side of the photoelectric conversion layer. Such concentration of the fluorine-containing polymer in the photoelectric conversion layer presumably allows the electrons and holes generated by photoexcitation to efficiently move without being recombined, thus improving the photoelectric conversion efficiency of the solar cell. Accordingly, when $\alpha$ is more than 0.6, the solar cell of the present invention can exhibit high photoelectric conversion efficiency. $\alpha$ is more preferably 0.7 or more, still more preferably 0.8 or more.

Meanwhile, satisfying β<0.2 presumably indicates that fluorine elements are hardly present on the cathode side of the photoelectric conversion layer in the solar cell, in other words, the fluorine-containing polymer is concentrated at the very surface on the anode side of the photoelectric conversion layer and hardly present on most of the cathode side. When most of the photoelectric conversion layer is free from the fluorine-containing polymer as described above, the solar cell presumably can have improved light resistance. Accordingly, when β is less than 0.2, the solar cell of the present invention can exhibit high light resistance. β is more preferably 0.15 or less, still more preferably 0.1 or less.

Examples of the method of concentrating the fluorine-containing polymer at the very surface on the anode side of the photoelectric conversion layer to satisfy α>0.6 and β<0.2 include a method of adjusting the weight average molecular weight of the fluorine-containing polymer and the amount of the fluorine-containing polymer in the photoelectric conversion layer.

Specifically, for example, the fluorine-containing polymer is added to a solution containing a compound as a raw material of the organic-inorganic perovskite compound to prepare a coating solution. The coating solution is applied and then dried and fired to form a photoelectric conversion layer. Adjustment of the weight average molecular weight of the fluorine-containing polymer to a specific value or more at this time allows segregation of the fluorine-containing polymer during the formation of the photoelectric conversion layer, thus allowing concentration thereof at the very surface on the anode side of the photoelectric conversion layer.

The lower limit of the weight average molecular weight of the fluorine-containing polymer is preferably 2,000 and the upper limit thereof is preferably 1,000,000. When the weight average molecular weight of the fluorine-containing polymer is within this range, α>0.6 and β<0.2 can be reliably satisfied. The lower limit of the molecular weight of the fluorine-containing polymer is more preferably 4,000 and the upper limit thereof is more preferably 500,000. The lower limit is still more preferably 5,000 and the upper limit is still more preferably 100,000.

In the photoelectric conversion layer, the lower limit of the amount of the fluorine-containing polymer is preferably 0.1% by weight and the upper limit thereof is preferably 30% by weight. When the amount of the fluorine-containing polymer is within this range, α>0.6 and β<0.2 can be reliably satisfied. The lower limit of the amount of the fluorine-containing polymer is more preferably 0.5% by weight and the upper limit thereof is more preferably 20% by weight. The lower limit is still more preferably 1% by weight and the upper limit is still more preferably 15% by weight.

Other examples of the acidic polymer include polystyrenesulfonic acid of the following formula and polystyrenesulfonyl-trifluoromethanesulfonimide.

[Chem. 5]

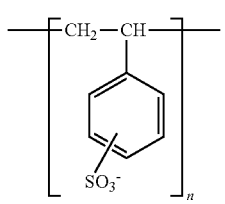

In the photoelectric conversion layer, the lower limit of the amount of the acidic polymer is preferably 0.1% by weight and the upper limit thereof is preferably 30% by weight. When the amount of the acidic polymer is within this range, both high photoelectric conversion efficiency and high heat resistance can be achieved. The lower limit of the acidic polymer is more preferably 0.5% by weight and the upper limit thereof is more preferably 20% by weight. The lower limit is still more preferably 1% by weight and the upper limit is still more preferably 15% by weight.

The photoelectric conversion layer may further contain an organic semiconductor or an inorganic semiconductor, in addition to the organic-inorganic perovskite compound and the acidic polymer, as long as the effects of the present invention are not impaired. The organic semiconductor or inorganic semiconductor herein may serve as a hole transport layer or an electron transport layer.

Examples of the organic semiconductor include compounds having a thiophene skeleton, such as poly(3-alkylthiophene). The examples also include conductive polymers having a poly-p-phenylenevinylene skeleton, a polyvinylcarbazole skeleton, a polyaniline skeleton, a polyacetylene skeleton, or the like. The examples further include: compounds having a phthalocyanine skeleton, a naphthalocyanine skeleton, a pentacene skeleton, a porphyrin skeleton such as a benzoporphyrin skeleton, a spirobifluorene skeleton, or the like; and carbon-containing materials such as carbon nanotube, graphene, and fullerene, each of which may be surface-modified.

Examples of the inorganic semiconductor include titanium oxide, zinc oxide, indium oxide, tin oxide, gallium oxide, tin sulfide, indium sulfide, zinc sulfide, CuSCN, $Cu_2O$, CuI, $MoO_3$, $V_2O_5$, $WO_3$, $MoS_2$, $MoSe_2$, and $Cu_2S$.

The photoelectric conversion layer may be a laminate in which a thin-film organic semiconductor or inorganic semiconductor part and a thin-film organic-inorganic perovskite compound/acidic polymer part are stacked, or may be a composite film in which an organic semiconductor or inorganic semiconductor part and an organic-inorganic perovskite compound part/acidic polymer part are combined. The laminate is preferred from the viewpoint of a simple production process. The composite film is preferred from the viewpoint of improvement in charge separation efficiency in the organic semiconductor or the inorganic semiconductor.

The lower limit of the thickness of the thin-film organic-inorganic perovskite compound/acidic polymer part is preferably 5 nm and the upper limit thereof is preferably 5,000 nm. When the thickness is 5 nm or greater, the thin-film organic-inorganic perovskite compound/acidic polymer part can sufficiently absorb light, enhancing the photoelectric conversion efficiency. When the thickness is 5,000 nm or smaller, formation of a region which fails to achieve charge separation can be reduced, improving the photoelectric conversion efficiency. The lower limit of the thickness is more preferably 10 nm and the upper limit thereof is more preferably 1,000 nm. The lower limit of the thickness is still more preferably 20 nm and the upper limit thereof is still more preferably 500 nm.

When the photoelectric conversion layer is a composite film in which an organic semiconductor or inorganic semiconductor part and an organic-inorganic perovskite compound/acidic polymer part are combined, the lower limit of the thickness of the composite film is preferably 30 nm and the upper limit thereof is preferably 3,000 nm. When the thickness is 30 nm or greater, the composite film can sufficiently absorb light, enhancing the photoelectric conversion efficiency. When the thickness is 3,000 nm or smaller, charges are likely to reach the electrode, enhancing the photoelectric conversion efficiency. The lower limit of the thickness is more preferably 40 nm and the upper limit thereof is more preferably 2,000 nm. The lower limit is still more preferably 50 nm and the upper limit is still more preferably 1,000 nm.

The photoelectric conversion layer may be formed by any method. Examples of the method include a vacuum evaporation method, a sputtering method, a chemical vapor deposition method (CVD), an electrochemical sedimentation method, and a printing method. In particular, the use of a printing method enables easy formation of a large-area solar cell that can exhibit high photoelectric conversion efficiency.

Specifically, in an exemplary method, $CH_3NH_3I$ and $PbI_2$ are dissolved at a molar ratio of 1:1 in N,N-dimethylformamide (DMF) as a solvent to give a solution. In the solution is dissolved the acidic polymer prepared in advance, whereby a coating solution is prepared. The coating solution is printed by a method such as a spin coating method, a casting method, or a roll-to-roll method.

The solar cell of the present invention includes, in the stated order, a cathode, the photoelectric conversion layer, and an anode.

The material of the cathode is not limited and may be a conventionally known material. Examples of the material of the cathode include fluorine-doped tin oxide (FTO), sodium, sodium-potassium alloys, lithium, magnesium, aluminum, magnesium-silver mixtures, magnesium-indium mixtures, aluminum-lithium alloys, $Al/Al_2O_3$ mixtures, and Al/LiF mixtures. These materials may be used alone or in combination of two or more thereof.

The material of the anode is not limited and may be a conventionally known material. The anode is a patterned electrode in many cases.

Examples of the material of the anode include conductive transparent materials such as indium tin oxide (ITO), $SnO_2$, aluminum zinc oxide (AZO), indium zinc oxide (IZO), gallium zinc oxide (GZO), and boron zinc oxide (BZO) and conductive transparent polymers. These materials may be used alone or in combination of two or more thereof.

The solar cell of the present invention may include a hole transport layer between the anode and the photoelectric conversion layer.

The hole transport layer may be formed from any material. Examples of the material include P-type conductive polymers, P-type low-molecular organic semiconductors, P-type metal oxides, P-type metal sulfides, and surfactants. Specific examples thereof include compounds having a thiophene skeleton such as poly(3-alkylthiophene). The examples also include conductive polymers having, for example, a triphenylamine skeleton, a polyparaphenylenevinylene skeleton, a polyvinyl carbazole skeleton, a polyaniline skeleton, or a polyacetylene skeleton. The examples also include compounds having, for example, a phthalocyanine skeleton, a naphthalocyanine skeleton, a pentacene skeleton, a porphyrin skeleton such as a benzoporphyrin skeleton, or a spirobifluorene skeleton. The examples also include molybdenum oxide, vanadium oxide, tungsten oxide, nickel oxide, copper oxide, tin oxide, molybdenum sulfide, tungsten sulfide, copper sulfide, and tin sulfide. The examples further include fluoro group-containing phosphonic acid, carbonyl group-containing phosphonic acid, copper compounds such as CuSCN and CuI, and carbon-containing materials such as carbon nanotube and graphene.

The hole transport layer may contain the acidic polymer. The hole transport layer containing the acidic polymer leads to higher photoelectric conversion efficiency.

Here, when the hole transport layer containing the acidic polymer is stacked on the photoelectric conversion layer, the acidic polymer in the hole transport layer may migrate into the photoelectric conversion layer and reduce the heat resistance of the resulting solar cell. Thus, the structure of the solar cell needs to be designed in consideration of the possibility of the migration of the acidic polymer in the hole transport layer into the photoelectric conversion layer.

The possibility of the migration of the acidic polymer in the hole transport layer into the photoelectric conversion layer can be summarized as follows.

(a) The smaller the weight average molecular weight of the acidic polymer, the more likely the acidic polymer is to migrate. The larger the weight average molecular weight of the acidic polymer, the less likely the acidic polymer is to migrate.

(b) The acidic polymer is more likely to migrate when no firing is performed in the formation of the hole transport layer, and is less likely to migrate when firing is performed. In the case where firing is performed, the acidic polymer is even less likely to migrate when pre-firing and post-firing are performed than when only pre-firing is performed.

The lower limit of the thickness of the hole transport layer is preferably 1 nm and the upper limit thereof is preferably 2,000 nm. The hole transport layer having a thickness of 1 nm or more can sufficiently block electrons. The hole transport layer having a thickness of 2,000 nm or less is less likely to serve as resistance to hole transport, thus enhancing the photoelectric conversion efficiency. The lower limit of the thickness is more preferably 3 nm and the upper limit thereof is more preferably 1,000 nm. The lower limit is still more preferably 5 nm and the upper limit is still more preferably 500 nm.

The solar cell of the present invention may have an electron transport layer between the cathode and the photoelectric conversion layer.

The electron transport layer may be formed from any material. Examples of the material include N-type metal oxides, N-type conductive polymers, N-type low-molecular organic semiconductors, alkali metal halides, alkali metals, and surfactants. Specific examples thereof include titanium oxide, tin oxide, cyano group-containing polyphenylene vinylene, boron-containing polymers, bathocuproine, bathophenanthroline, (hydroxyquinolinato)aluminum, oxadiazole compounds, benzoimidazole compounds, naphthalenetetracarboxylic acid compounds, perylene derivatives, phosphine oxide compounds, phosphine sulfide compounds, and fluoro group-containing phthalocyanine.

In particular, from the viewpoint of reducing diffusion of iodine atoms from the organic-inorganic perovskite compound contained in the photoelectric conversion layer to the cathode, n-type metal oxides, alkali metal halides, and alkali metals are preferred. The use of these materials can increase the density of the electron transport layer, further reducing diffusion of iodine atoms from the organic-inorganic perovskite compound contained in the photoelectric conversion layer. Further, from the viewpoint of preventing corrosion of the electron transport layer by iodine atoms, an oxide containing a metal having a relatively low ionization tendency (e.g., titanium oxide, tin oxide) is more preferred. The use of these materials can increase the stability of the electron transport layer, improving the durability of the solar cell.

The electron transport layer may consist only of a thin-film electron transport layer. Still, the electron transport layer preferably includes a porous electron transport layer. In particular, when the photoelectric conversion layer is a composite film in which an organic semiconductor or inorganic semiconductor part and an organic-inorganic perovskite compound/acidic polymer part are combined, the composite film is preferably formed on a porous electron transport layer because a more complicated composite film (more intricate structure) can be obtained, enhancing the photoelectric conversion efficiency.

The lower limit of the thickness of the electron transport layer is preferably 1 nm and the upper limit thereof is preferably 2,000 nm. When the thickness is 1 nm or greater, holes can be sufficiently blocked. When the thickness is 2,000 nm or smaller, the electron transport layer is less likely to serve as resistance to electron transport, enhancing the photoelectric conversion efficiency. The lower limit of the thickness of the electron transport layer is more preferably 3 nm and the upper limit thereof is more preferably 1,000 nm. The lower limit is still more preferably 5 nm and the upper limit is still more preferably 500 nm.

The solar cell of the present invention may further include a substrate or the like. The substrate may be any one, and examples thereof include transparent glass substrates made of soda-lime glass, alkali-free glass, or the like, ceramic substrates, plastic substrates, and metal substrates.

The solar cell of the present invention may further include a barrier layer that seals the laminate including the cathode, (optionally the electron transport layer), the photoelectric conversion layer, (optionally the hole transport layer), and the anode in the stated order.

The barrier layer may be formed from any material that exhibits barrier performance. Examples of the material include thermosetting resins, thermoplastic resins, and inorganic materials.

Examples of the thermosetting resins and the thermoplastic resins include epoxy resin, acrylic resin, silicone resin, phenol resin, melamine resin, and urea resin. The examples also include butyl rubber, polyester, polyurethane, polyethylene, polypropylene, polyvinyl chloride, polystyrene, polyvinyl alcohol, polyvinyl acetate, ABS resin, polybutadiene, polyamide, polycarbonate, polyimide, and polyisobutylene.

When the material of the barrier layer is a thermosetting resin or a thermoplastic resin, the lower limit of the thickness of the barrier layer (resin layer) is preferably 100 nm and the upper limit thereof is preferably 100,000 nm. The lower limit of the thickness is more preferably 500 nm and the upper limit thereof is more preferably 50,000 nm, the lower limit is still more preferably 1,000 nm and the upper limit is still more preferably 20,000 nm.

Examples of the inorganic material include oxides, nitrides, and oxynitrides of Si, Al, Zn, Sn, In, Ti, Mg, Zr, Ni, Ta, W, Cu, and alloys containing two or more species thereof. In particular, in order to impart water vapor barrier performance and flexibility to the barrier layer, an oxide, a nitride, or an oxynitride of metal elements including both metal elements Zn and Sn is preferred.

When the material of the barrier layer is an inorganic material, the lower limit of the thickness of the barrier layer (inorganic layer) is preferably 30 nm and the upper limit thereof is preferably 3,000 nm. When the thickness is 30 nm or greater, the inorganic layer can exhibit sufficient water vapor barrier performance, improving the durability of the solar cell. When the thickness is 3,000 nm or smaller, the stress generated is low even when the thickness of the inorganic layer is increased, reducing separation of the inorganic layer and the laminate. The lower limit of the thickness is more preferably 50 nm and the upper limit thereof is more preferably 1,000 nm. The lower limit is still more preferably 100 nm and the upper limit is still more preferably 500 nm.

The thickness of the inorganic layer can be measured using an optical interference-type thickness meter (e.g., FE-3000 available from Otsuka Electronics Co., Ltd.).

Sealing of the laminate using the thermosetting resin or thermoplastic resin among the materials of the barrier layer may be achieved by any method. Examples of the method include a method of sealing the laminate using a material of a sheet-like barrier layer and a method of applying a solution containing a material of the barrier layer dissolved in an organic solvent to the laminate. The examples also include a method of applying a liquid monomer to be the barrier layer to the laminate and then crosslinking or polymerizing the liquid monomer by heat, UV, or the like, and a method of melting a material of the barrier layer by heat and then cooling the molten material.

Sealing of the laminate using the inorganic material among the materials of the barrier layer is preferably achieved by a vacuum vapor deposition method, a sputtering method, a chemical vapor deposition (CVD) method, or an ion plating method. In particular, in order to form a dense layer, a sputtering method is preferred. A DC magnetron sputtering method is more preferred among sputtering methods.

In the sputtering method, a metal target and oxygen gas or nitrogen gas are used as starting materials and the starting materials are deposited on the laminate to form a film. Thereby, an inorganic layer formed from an inorganic material can be formed.

The material of the barrier layer may be a combination of the thermosetting resin or thermoplastic resin and the inorganic material.

In the solar cell of the present invention, the barrier layer may be further covered with an additional material such as a resin film or a resin film covered with an inorganic material. In other words, the solar cell of the present invention may have a structure in which sealing, filling, or bonding between the laminate and the additional material may be attained by the barrier layer. Thereby, water vapor can be sufficiently blocked even if a pinhole is present in the barrier layer, further improving the durability of the solar cell.

FIG. 3 is a schematic cross-sectional view of an exemplary solar cell of the present invention.

A solar cell 1 illustrated in FIG. 3 includes an electron transport layer 3 (a thin-film electron transport layer 31 and a porous electron transport layer 32), a photoelectric conversion layer 4 containing an organic-inorganic perovskite compound and an acidic polymer, a hole transport layer 5, and an anode 6 stacked in the stated order on a cathode 2. In the solar cell 1 illustrated in FIG. 3, the anode 6 is a patterned electrode.

The solar cell of the present invention may be produced by any method. An exemplary method includes forming, on the substrate, the cathode, the electron transport layer, the photoelectric conversion layer, the hole transport layer, and the anode in the stated order.

Advantageous Effects of Invention

The present invention can provide a solar cell that includes a photoelectric conversion layer containing an organic-inorganic perovskite compound and that can exhibit high photoelectric conversion efficiency and high heat resistance.

DESCRIPTION OF EMBODIMENTS

Figure 1:
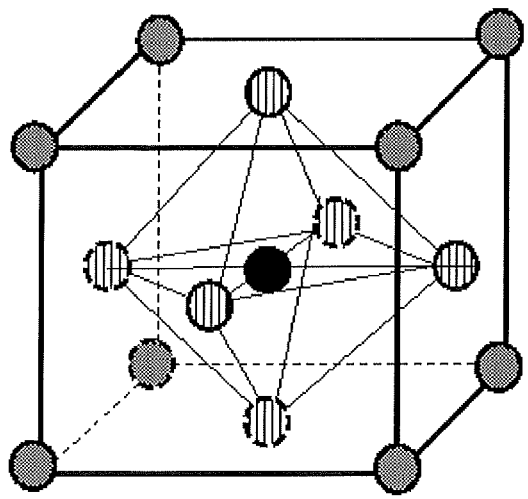
FIG. 1 is a schematic view of an exemplary crystalline structure of an organic-inorganic perovskite compound.
Figure 2:
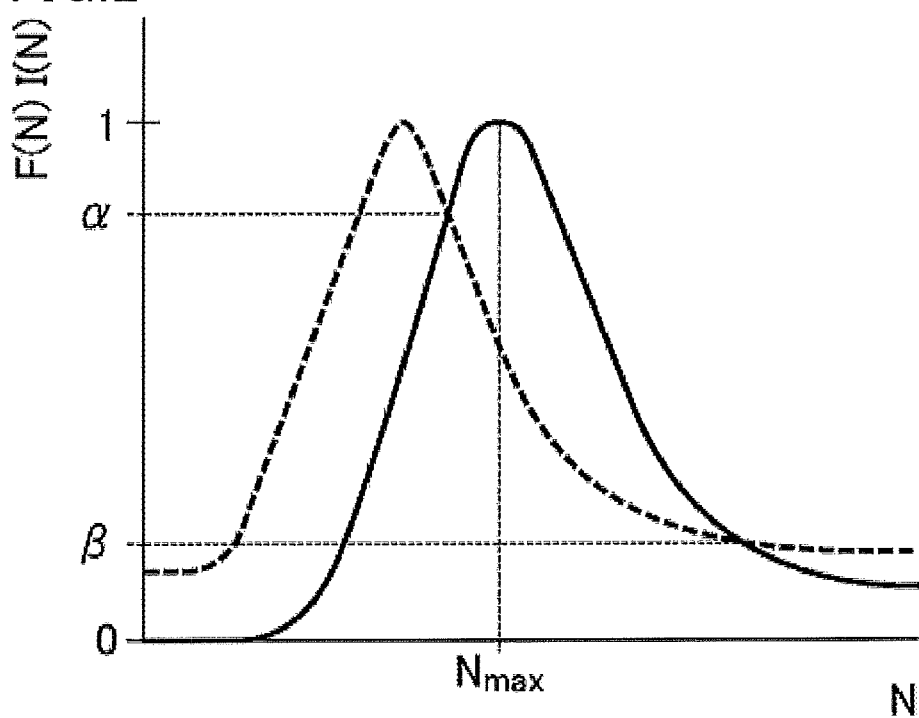
FIG. 2 is a schematic view illustrating a graph plotted with sputtering cumulative time N on the horizontal axis and F(N) and I(N) values normalized to their maximum values as 1 on the vertical axis.
Figure 3:
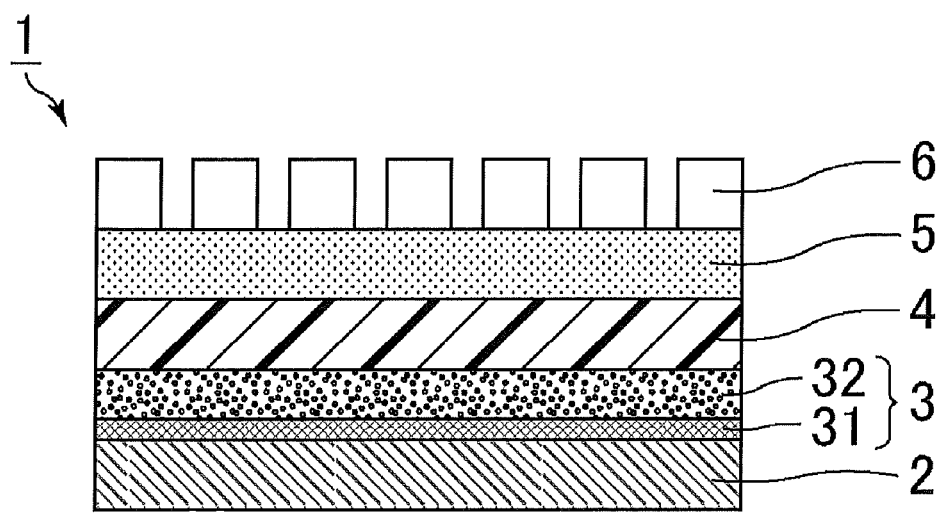
FIG. 3 is a schematic cross-sectional view of an exemplary solar cell of the present invention.

Embodiments of the present invention are more specifically described with reference to, but not limited to, the following examples.

Example 1

(1) Synthesis of Acidic Polymer

An amount of 15 g of p-styrenesulfonic acid and 30 mL of thionyl chloride were reacted in 70 mL of DMF for three hours, followed by separation to give styrene sulfonyl chloride. The obtained styrene sulfonyl chloride and 10 g of trifluoromethanesulfonamide were then added to a solution obtained by adding 0.23 g of dimethylaminopyridine to 13 mL of triethylamine, and they were reacted. Thereafter, 17 g of silver oxide was added to give precipitate, whereby a fluorine atom-containing monomer was obtained.

The obtained fluorine atom-containing monomer was then reacted in an argon atmosphere at 65° C. for 18 hours using azobisisobutyronitrile as a polymerization initiator. This produced a silver salt of an acidic polymer of the following formula (wherein m is an integer of 2 or more) having the structure of the formula ($1^H$) wherein $R^H$ is $CF_3$, that is, a silver salt of poly(N-styrenesulfonyl-trifluoromethanesulfonimide) (poly-TFSI).

The pKa of the obtained acidic polymer was determined by determining the equilibrium constant of the compound and a conjugate acid of the compound in an aqueous solution by ultraviolet-visible spectroscopy. Specifically, the pKa was determined by a method in accordance with the method disclosed in the following document. The acid dissociation constant pKa determined by this method was −5.0. "Steric Effects in Displacement Reactions. III. The Base Strengths of Pyridine, 2,6-Lutidine and the Monoalkylpyridines" HERBERT C. BROWN AND XAVIER R. MIHM, J. Am. Chem. Soc. 1955, Vol. 77, pp 1723-1726

The weight average molecular weight of the obtained acidic polymer was 50,000 as measured by gel permeation chromatography (GPC) using HSPgel RT MB-M (available from Waters Corporation) as a column and dimethylsulfoxide as a solvent.

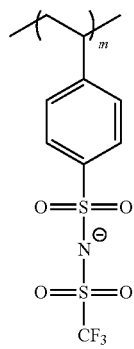

[Chem. 6]

The obtained silver salt of the acidic polymer was mixed with methylamine. The mixture was refined to give a methylamine salt of the acidic polymer. Similarly, the obtained silver salt of the acidic polymer was mixed with Spiro-OMeTAD. The mixture was refined to give a Spiro-OMeTAD salt of the acidic polymer.

(2) Preparation of Solar Cell

A FTO film having a thickness of 1,000 nm as a cathode was formed on a glass substrate. The FTO film was subjected to ultrasonic cleaning using pure water, acetone, and methanol in the stated order, each for 10 minutes. The FTO film was then dried to form a cathode formed of a FTO film.

To a surface of the obtained cathode was applied, by a spin coating method, a titanium isopropoxide solution in ethanol adjusted to 2%, followed by firing at 400° C. for 10 minutes to give a thin-film electron transport layer having a thickness of 20 nm. To the thin-film electron transport layer was applied, by a spin coating method, a titanium oxide paste containing polyisobutyl methacrylate as an organic binder and titanium oxide (mixture of particles having an average particle size of 10 nm and particles having an average size of 30 nm). The titanium oxide paste was then fired at 500° C. for 10 minutes to form a porous electron transport layer having a thickness of 100 nm.

$PbI_2$ was dissolved in a solvent mixture of N,N-dimethylformamide (DMF) and dimethylsulfoxide (DMSO). The solution was applied to the electron transport layer by spin coating. Subsequently, a mixture of $CH_3NH_3I$ and the methylamine salt of the acidic polymer at a weight ratio of 9:1 was dissolved in isopropanol. The solution was applied by spin coating and fired at 150° C. for five minutes to form a photoelectric conversion layer having a thickness of 400 nm.

An amount of 5 mg of the obtained Spiro-OMeTAD salt of the acidic polymer, 30 μL of t-butylpyridine, and 15 mg of Spiro-OMeTAD were dissolved in 1 mL of chlorobenzene to prepare a coating solution for hole transport layer formation.

The coating solution for hole transport layer formation was applied to the photoelectric conversion layer by a spin coating method to a thickness of 50 nm. Immediately after the formation of the hole transport layer, firing (pre-firing) was performed at 100° C. for 10 minutes to form a hole transport layer.

An ITO film having a thickness of 100 nm as an anode was formed on the obtained hole transport layer by vacuum evaporation to form a solar cell including the cathode, the electron transport layer, the photoelectric conversion layer, the hole transport layer, and the anode stacked together.

Example 2

A solar cell was obtained as in Example 1 except that polystyrenesulfonic acid was used as the acidic polymer.

The polystyrenesulfonic acid used had an acid dissociation constant pKa of −2.8 and a weight average molecular weight of 50,000.

Comparative Examples 1 to 7

A solar cell was obtained as in Example 1 except that instead of the acidic polymer, a polymer or monomer shown in Table 1 other than an acidic polymer was used.

<Evaluation>

The solar cells obtained in the examples and the comparative examples were evaluated as follows. Table 1 shows the results.

(1) Measurement of Photoelectric Conversion Efficiency

A power source (model 236, available from Keithley Instruments Inc.) was connected between the electrodes of the solar cell. A current-voltage curve was drawn using a solar simulator (available from Yamashita Denso Corp.) at an intensity of 100 mW/cm$^2$, and the photoelectric conversion efficiency was calculated.

The obtained photoelectric conversion efficiency was evaluated as "5" when it was 15% or higher, "4" when it was 13% or higher and lower than 15%, "3" when it was 11% or higher and lower than 13%, "2" when it was 9% or higher and lower than 11%, and "1" when it was lower than 9%.

(2) Evaluation of Heat Resistance

The obtained solar cell was put in an 85° C. oven. The photoelectric conversion efficiency after 500 hours was measured.

The heat resistance was evaluated as "5" when the conversion efficiency after 500 hours was 90% or higher of the initial conversion efficiency, "4" when it was 80% or higher and lower than 90% of the initial conversion efficiency, "3" when it was 60% or higher and lower than 80% of the initial conversion efficiency, "2" when it was 40% or higher and lower than 60% of the initial conversion efficiency, and "1" when it was lower than 40% of the initial conversion efficiency.

Example 3

(1) Synthesis of Fluorine-Containing Polymer

An amount of 15 g of p-styrenesulfonic acid and 30 mL of thionyl chloride were reacted in 70 ml of DMF for three hours, followed by separation to give styrene sulfonyl chloride. The obtained styrene sulfonyl chloride and 10 g of trifluoromethanesulfonamide were then added to a solution obtained by adding 0.23 g of dimethylaminopyridine to 13 mL of triethylamine, and they were reacted. Thereafter, 17 g of silver oxide was added to give precipitate, whereby a fluorine atom-containing monomer was obtained.

The obtained fluorine atom-containing monomer was then reacted in an argon atmosphere at 65° C. for 18 hours using azobisisobutyronitrile as a polymerization initiator. This produced a silver salt of a fluorine-containing polymer of the following formula (wherein m is an integer of 2 or more) having the structure of the formula (1$^F$) wherein R$^F$ is CF$_3$, that is, a silver salt of poly(N-styrenesulfonyl-trifluoromethanesulfonimide) (poly-TFSI).

The pKa of the obtained fluorine-containing polymer was −5.0 as measured by determining the equilibrium constant of the compound and a conjugate acid of the compound in an aqueous solution by ultraviolet-visible spectroscopy.

The weight average molecular weight of the obtained fluorine-containing polymer was 50,000 as measured by gel permeation chromatography (GPC) using HSPgel RT MB-M (available from Waters Corporation) as a column and dimethylsulfoxide as a solvent.

TABLE 1

| | Photoelectric conversion layer | | | | | Evaluation | |
|---|---|---|---|---|---|---|---|
| | Acidic polymer | Polymer other than acidic polymer | Acidic monomer | pKa | Weight average molecular weight | Conversion efficiency | Heat resistance |
| Example 1 | Poly-TFSI | — | — | −5.0 | 50000 | 5 | 6 |
| Example 2 | Polystyrene-sulfonic acid | — | — | −2.8 | 50000 | 4 | 4 |
| Comparative Example 1 | — | Polyacrylic acid | — | 4.3 | 25000 | 3 | 5 |
| Comparative Example 2 | — | Polyvinylidene fluoride | — | 14.0 | 60000 | 2 | 5 |
| Comparative Example 3 | — | Methyl polymethacrylate | — | 13.0 | 100000 | 2 | 5 |
| Comparative Example 4 | — | Polyacrylamide | — | 4.0 | 50000 | 2 | 5 |
| Comparative Example 5 | — | Polyamic acid | — | 5.0 | 30000 | 1 | 4 |
| Comparative Example 6 | — | — | TFSI | −5.0 | — | 5 | 2 |
| Comparative Example 7 | — | — | p-Toluenesulfonic acid | −2.8 | — | 4 | 1 |

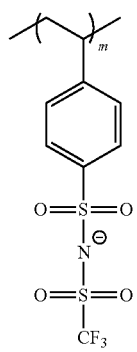

[Chem. 7]

The obtained silver salt of the fluorine-containing polymer was mixed with methylamine. The mixture was refined to give a methylamine salt of the fluorine-containing polymer. Similarly, the obtained silver salt of the fluorine-containing polymer was mixed with 2,2',7,7'-tetrakis-(N,N-di-methoxyphenylamine)-9,9'-spirobifluorene (Spiro-OMeTAD). The mixture was refined to give a Spiro-OMeTAD salt of the fluorine-containing polymer.

(2) Preparation of Solar Cell

A FTO film having a thickness of 1,000 nm as a cathode was formed on a glass substrate. The FTO film was subjected to ultrasonic cleaning using pure water, acetone, and methanol in the stated order, each for 10 minutes. The FTO film was then dried to form a cathode formed of a FTO film.

To a surface of the obtained cathode was applied, by a spin coating method, a titanium isopropoxide solution in ethanol adjusted to 2%, followed by firing at 400° C. for 10 minutes to give a thin-film electron transport layer having a thickness of 20 nm. To the thin-film electron transport layer was applied, by a spin coating method, a titanium oxide paste containing polyisobutyl methacrylate as an organic binder and titanium oxide (mixture of particles having an average particle size of 10 nm and particles having an average size of 30 nm). The titanium oxide paste was then fired at 500° C. for 10 minutes to form a porous electron transport layer having a thickness of 100 nm.

$PbI_2$ was dissolved in a solvent mixture of N,N-dimethylformamide (DMF) and dimethylsulfoxide (DMSO). The solution was applied to the electron transport layer by spin coating. Subsequently, a mixture of $CH_3NH_3I$ and the methylamine salt of the fluorine-containing polymer at a weight ratio of 9:1 was dissolved in isopropanol. The solution was applied by spin coating and fired at 150° C. for five minutes to form a photoelectric conversion layer having a thickness of 400 nm.

An amount of 5 mg of the obtained Spiro-OMeTAD salt of the fluorine-containing polymer, 30 μL of t-butylpyridine, and 15 mg of Spiro-OMeTAD were dissolved in 1 mL of chlorobenzene to prepare a coating solution for hole transport layer formation.

The coating solution for hole transport layer formation was applied to the photoelectric conversion layer by a spin coating method to a thickness of 50 nm. Immediately after the formation of the hole transport layer, firing (pre-firing) was performed at 100° C. for 10 minutes to form a hole transport layer.

An ITO film having a thickness of 100 nm as an anode was formed on the obtained hole transport layer by vacuum evaporation. Immediately after the formation of the anode, firing (post-firing) was performed at 100° C. for 10 minutes to form a solar cell including the cathode, the electron transport layer, the photoelectric conversion layer, the hole transport layer, and the anode stacked together.

(3) Calculation of α and β

α and β were calculated by the steps (A) to (C) described above. α was 0.90. β was 0.10.

Examples 4 and 5

A solar cell was obtained as in Example 3 except that the method of forming the hole transport layer was changed as shown in Table 2. α and β were calculated by the steps (A) to (C).

Example 6

A solar cell was obtained as in Example 3 except that a trifluoromethanesulfonylimide monomer, which is a fluorine-containing monomer, was used in a coating solution for hole transport layer formation instead of the fluorine-containing polymer. α and β were calculated by the steps (A) to (C).

Example 7

A solar cell was obtained as in Example 3 except that the method of forming the hole transport layer was shown in Table 2. α and β were calculated by the steps (A) to (C).

Comparative Example 8

A solar cell was obtained as in Example 3 except that a trifluoromethanesulfonylimide monomer as a fluorine-containing monomer was used in a coating solution for photoelectric conversion layer formation instead of the fluorine-containing polymer. α and β were calculated by the steps (A) to (C).

Comparative Examples 9 to 11

A solar cell was obtained as in Comparative Example 8 except that the method of forming the hole transport layer was as shown in Table 2. α and β were calculated by the steps (A) to (C).

Comparative Example 12

A solar cell was obtained as in Example 3 except that neither the fluorine-containing polymer nor the fluorine-containing monomer was added to the coating solution for photoelectric conversion layer formation. A solar cell was obtained as in Example 1 except that the coating solution for photoelectric conversion layer formation was used. α and β were calculated by the steps (A) to (C).

Comparative Examples 13 to 18

A solar cell was obtained as in Comparative Example 12 except that the method of forming the hole transport layer was shown in Table 2. α and β were calculated by the steps (A) to (C).

(Evaluation)

The solar cells obtained in the examples and the comparative examples were evaluated as follows.

Table 2 shows the results.

(1) Evaluation of Photoelectric Conversion Efficiency

A power source (model 236, available from Keithley Instruments Inc.) was connected between the electrodes of the solar cell. A current-voltage curve was drawn using a solar simulator (available from Yamashita Denso Corp.) at an intensity of 100 mW/cm$^2$, and the photoelectric conversion efficiency was calculated.

The obtained photoelectric conversion efficiency was evaluated as "5" when it was 15% or higher, "4" when it was 13% or higher and lower than 15%, "3" when it was 11% or higher and lower than 13%, "2" when it was 9% or higher and lower than 11%, and "1" when it was lower than 9%.

(2) Evaluation of Heat Resistance

The obtained solar cell was put in an 85° C. oven. The photoelectric conversion efficiency after 500 hours was measured.

The heat resistance was evaluated as "5" when the conversion efficiency after 500 hours was 90% or more of the initial conversion efficiency, "4" when it was 80% or higher and lower than 90% of the initial conversion efficiency, "3" when it was 60% or higher and lower than 80% of the initial conversion efficiency, "2" when it was 40% or higher and lower than 60% of the initial conversion efficiency, and "1" when it was lower than 40% of the initial conversion efficiency.

(3) Evaluation of Light Resistance

The solar cell was put in Sunshine Xenon Weather Meter (available from Suga Test Instruments Co., Ltd.) and irradiated with light corresponding to an intensity of 100 mW/cm$^2$ at 60° C. for 100 hours. The photoelectric conversion efficiency before and after the light irradiation was calculated by the same method as above.

The light resistance was evaluated as "5" when the conversion efficiency after the light irradiation was 90% or higher of the conversion efficiency before the light irradiation (initial conversion efficiency), "4" when it was 80% or higher and lower than 90% of the initial conversion efficiency, "3" when it was 60% or higher and lower than 80% of the initial conversion efficiency, "2" when it was 40% or higher and lower than 60% of the initial conversion efficiency, and "1" when it was lower than 40% of the initial conversion efficiency.

TABLE 2

| | Photoelectric conversion layer | | | Hole transport layer | | | | | | | Evaluation | | |
|---|---|---|---|---|---|---|---|---|---|---|---|---|---|
| | Organic-inorganic perovskite compound | Fluorine-containing polymer | Fluorine-containing monomer | t-Butyl-pyridine | Fluorine-containing polymer | Fluorine-containing monomer | Pre-firing | Post-firing | α | β | Photoelectric conversion efficiency | Heat resistance | Light resistance |
| Example 3 | ○ | ○ | x | ○ | ○ | x | ○ | ○ | 0.90 | 0.10 | 5 | 5 | 5 |
| Example 4 | ○ | ○ | x | ○ | ○ | x | ○ | x | 0.70 | 0.10 | 4 | 5 | 5 |
| Example 5 | ○ | ○ | x | ○ | x | x | ○ | ○ | 0.90 | 0.10 | 5 | 5 | 5 |
| Example 6 | ○ | ○ | x | ○ | x | ○ | ○ | ○ | 0.90 | 0.18 | 5 | 3 | 4 |
| Example 7 | ○ | ○ | x | x | x | ○ | x | x | 0.80 | 0.13 | 5 | 3 | 4 |
| Comparative Example 8 | ○ | x | ○ | ○ | ○ | x | ○ | ○ | 0.90 | 0.21 | 5 | 2 | 3 |
| Comparative Example 9 | ○ | x | ○ | ○ | x | ○ | ○ | ○ | 0.90 | 0.23 | 5 | 1 | 2 |
| Comparative Example 10 | ○ | x | ○ | ○ | x | ○ | x | x | 0.90 | 0.30 | 5 | 1 | 1 |
| Comparative Example 11 | ○ | x | ○ | ○ | x | x | ○ | ○ | 0.90 | 0.30 | 5 | 2 | 1 |
| Comparative Example 12 | ○ | x | x | ○ | ○ | x | ○ | ○ | 0.40 | 0.10 | 3 | 5 | 5 |
| Comparative Example 13 | ○ | x | x | ○ | ○ | x | ○ | x | 0.30 | 0.10 | 2 | 5 | 5 |
| Comparative Example 14 | ○ | x | x | ○ | x | ○ | ○ | ○ | 0.70 | 0.20 | 4 | 3 | 3 |
| Comparative Example 15 | ○ | x | x | ○ | x | ○ | ○ | x | 0.20 | 0.14 | 1 | 3 | 4 |
| Comparative Example 16 | ○ | x | x | ○ | x | ○ | x | x | 0.70 | 0.30 | 4 | 2 | 1 |
| Comparative Example 17 | ○ | x | x | ○ | x | ○ | x | x | 0.20 | 0.14 | 1 | 2 | 4 |
| Comparative Example 18 | ○ | x | x | ○ | x | x | ○ | ○ | 0.20 | 0.10 | 1 | 5 | 5 |

INDUSTRIAL APPLICABILITY

The present invention can provide a solar cell that includes a photoelectric conversion layer containing an organic-inorganic perovskite compound and that can exhibit high photoelectric conversion efficiency and high heat resistance.

REFERENCE SIGNS LIST 1 solar cell
2 cathode
3 electron transport layer
31 thin-film electron transport layer
32 porous electron transport layer
4 photoelectric conversion layer containing organic-inorganic perovskite compound and acidic polymer
5 hole transport layer
6 anode (patterned electrode)

The invention claimed is:

1. A solar cell comprising, in the stated order:
a cathode;
a photoelectric conversion layer; and
an anode,
the photoelectric conversion layer containing an organic-inorganic perovskite compound represented by the formula R-M-X$_3$ where R is an organic molecule, M is a metal atom, and X is a halogen atom or a chalcogen atom, and a polymer having an acid dissociation constant pKa of 3 or less,
wherein the polymer having an acid dissociation constant pKa of 3 or less is a halogen-containing polymer that has a structure of the following formula ($X^H$) containing a halogen atom and electron-withdrawing groups bonded to a hetero atom:

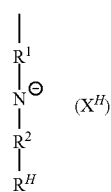

[Chem. 1]

wherein $R^1$ and $R^2$ are each an electron-withdrawing group, $R^H$ is a group containing a halogen atom, and $R^1$ and $R^2$ may be the same as or different from each other.

2. The solar cell according to claim 1,
wherein the polymer having an acid dissociation constant pKa of 3 or less has a weight average molecular weight of 2,000 or more and 1,000,000 or less.

3. The solar cell according to claim 1,
wherein the polymer having an acid dissociation constant pKa of 3 or less is a fluorine-containing polymer containing a structural unit that has a structure of the following formula ($X^F$) containing a fluorine atom and electron-withdrawing groups bonded to a hetero atom:

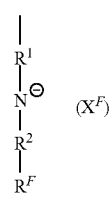

[Chem. 2]

wherein $R^1$ and $R^2$ are each an electron-withdrawing group, $R^F$ is a group containing a fluorine atom, and $R^1$ and $R^2$ may be the same as or different from each other.

4. The solar cell according to claim 3,
wherein on an anode-side surface, α and β calculated by the following steps (A) to (C) satisfy α>0.6 and β<0.2:
(A) performing sputtering on the anode-side surface n times, where n is an integer including 0, and measuring a ratio F(n) of the intensity of a fluoride ion to the total ion intensity (fluoride ion intensity/total ion intensity) and a ratio I(n) of the intensity of an iodide ion to the total ion intensity (iodide ion intensity/total ion intensity) on the surface by time-of-flight secondary ion mass spectrometry (TOF-SIMS) after each sputtering;
(B) based on the relation between n and F(n) and I(n) obtained in the step (A), calculating sputtering cumulative time N, a ratio F(N) of the intensity of the fluoride ion to the total ion intensity (fluoride ion intensity/total ion intensity) at the sputtering cumulative time N, and a ratio I(N) of the intensity of the iodide ion to the total ion intensity (iodide ion intensity/total ion intensity) at the sputtering cumulative time N; and
(C) based on the sputtering cumulative time N, F(N), and I(N) obtained in the step (B), plotting a graph with the sputtering cumulative time N on a horizontal axis and F(N) and I(N) values normalized to their maximum values as 1 on a vertical axis, and determining α as the value of I(N) and F(N) at an intersection of I(N) and F(N) at which N is closest to Nmax among intersections of I(N) and F(N) in a region of N<Nmax, and β as the value of I(N) and F(N) at an intersection of I(N) and F(N) at which N is closest to Nmax among intersections of I(N) and F(N) in a region of N≥Nmax, with Nmax being N at which I(N) reaches its maximum value.

5. The solar cell according to claim 1,
wherein the polymer having an acid dissociation constant pKa of 3 or less is polystyrenesulfonyl-trifluoromethanesulfonimide.

6. The solar cell according to claim 1, comprising a hole transport layer between the anode and the photoelectric conversion layer.

7. The solar cell according to claim 6,
wherein the hole transport layer contains the polymer having an acid dissociation constant pKa of 3 or less.

8. The solar cell according to claim 2,
wherein the polymer having an acid dissociation constant pKa of 3 or less is a fluorine-containing polymer containing a structural unit that has a structure of the following formula ($X^F$) containing a fluorine atom and electron-withdrawing groups bonded to a hetero atom:

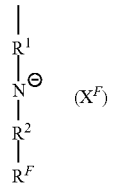

[Chem. 2]

wherein $R^1$ and $R^2$ are each an electron-withdrawing group, $R^F$ is a group containing a fluorine atom, and $R^1$ and $R^2$ may be the same as or different from each other.

9. The solar cell according to claim 8,
wherein on an anode-side surface, α and β calculated by the following steps (A) to (C) satisfy α>0.6 and β<0.2:
(A) performing sputtering on the anode-side surface n times, where n is an integer including 0, and measuring a ratio F(n) of the intensity of a fluoride ion to the total ion intensity (fluoride ion intensity/total ion intensity) and a ratio I(n) of the intensity of an iodide ion to the total ion intensity (iodide ion intensity/total ion intensity) on the surface by time-of-flight secondary ion mass spectrometry (TOF-SIMS) after each sputtering;
(B) based on the relation between n and F(n) and I(n) obtained in the step (A), calculating sputtering cumulative time N, a ratio F(N) of the intensity of the fluoride ion to the total ion intensity (fluoride ion intensity/total ion intensity) at the sputtering cumulative time N, and a ratio I(N) of the intensity of the iodide ion to the total ion intensity (iodide ion intensity/total ion intensity) at the sputtering cumulative time N; and (C) based on the sputtering cumulative time N, F(N), and I(N) obtained in the step (B), plotting a graph with the sputtering cumulative time N on a horizontal axis and F(N) and I(N) values normalized to their maximum values as 1 on a vertical axis, and determining α as the value of I(N) and F(N) at an intersection of I(N) and F(N) at which N is closest to Nmax among intersections of I(N) and F(N) in a region of N<Nmax, and β as the value of I(N) and F(N) at an intersection of I(N) and F(N) at which N is closest to Nmax among intersections of I(N) and F(N) in a region of N≥Nmax, with Nmax being N at which I(N) reaches its maximum value.

10. The solar cell according to claim 2,
wherein the polymer having an acid dissociation constant pKa of 3 or less is polystyrenesulfonyl-trifluoromethanesulfonimide.

11. The solar cell according to claim 2, comprising a hole transport layer between the anode and the photoelectric conversion layer.

12. The solar cell according to claim 11,
wherein the hole transport layer contains the polymer having an acid dissociation constant pKa of 3 or less.

\* \* \* \* \*